(12) United States Patent
Song et al.

(10) Patent No.: US 9,513,333 B2
(45) Date of Patent: Dec. 6, 2016

(54) TEST INTERFACE BOARD AND TEST SYSTEM INCLUDING THE SAME

(71) Applicant: Samsung Electronics Co., Ltd., Suwon-si, Gyeonggi-do (KR)

(72) Inventors: Ki-Jae Song, Goyang-si (KR); Jong-woon Yoo, Gwangmyeong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 129 days.

(21) Appl. No.: 14/458,241

(22) Filed: Aug. 12, 2014

(65) Prior Publication Data

US 2015/0070041 A1 Mar. 12, 2015

(30) Foreign Application Priority Data

Sep. 12, 2013 (KR) ........................ 10-2013-0109979

(51) Int. Cl.
| | |
|---|---|
| *G01R 31/00* | (2006.01) |
| *G01R 31/30* | (2006.01) |
| *G01R 31/28* | (2006.01) |
| *G11C 29/56* | (2006.01) |
| *G11C 5/14* | (2006.01) |

(52) U.S. Cl.
CPC ....... *G01R 31/3004* (2013.01); *G01R 31/2839* (2013.01); *G11C 29/56* (2013.01); *G01R 31/2889* (2013.01); *G11C 5/147* (2013.01); *G11C 2029/5602* (2013.01)

(58) Field of Classification Search
CPC ....... G01R 1/433; G01R 1/408; G01R 1/7342; G01R 31/2601; G01R 31/2834; G01R 31/3004; G01R 31/2889; G01R 31/2839
See application file for complete search history.

(56) References Cited

U.S. PATENT DOCUMENTS

| | | | |
|---|---|---|---|
| 6,897,666 B2 * | 5/2005 | Swettlen | G01R 1/07378 324/754.07 |
| 8,174,843 B2 | 5/2012 | Hayashi | |
| 2002/0003432 A1 * | 1/2002 | Leas | G01R 1/07314 324/750.05 |
| 2006/0104107 A1 | 5/2006 | Remington et al. | |
| 2008/0002373 A1 | 1/2008 | Arai et al. | |
| 2008/0137449 A1 | 6/2008 | Wu et al. | |
| 2009/0296360 A1 * | 12/2009 | Doblar | H05K 7/1061 361/767 |
| 2010/0181101 A1 | 7/2010 | Han et al. | |

(Continued)

FOREIGN PATENT DOCUMENTS

| | | |
|---|---|---|
| JP | 2000156548 A | 6/2000 |
| JP | 2007305642 A | 11/2007 |

(Continued)

*Primary Examiner* — Minh N Tang
(74) *Attorney, Agent, or Firm* — Renaissance IP Law Group LLP

(57) ABSTRACT

A test interface board includes a substrate including a power plane electrically connected to at least one power terminal of a semiconductor device under test, and a ground plane electrically connected to at least one ground terminal of the semiconductor device under test, and a voltage regulator arranged on the substrate and configured to supply, via the power plane and the ground plane, to the semiconductor device under test, a driving voltage.

20 Claims, 8 Drawing Sheets

(56) References Cited

U.S. PATENT DOCUMENTS

| | | | |
|---|---|---|---|
| 2012/0081859 A1* | 4/2012 | Christo | H05K 1/0263 361/736 |
| 2013/0021739 A1* | 1/2013 | Kim | H05K 1/0227 361/679.31 |
| 2013/0027067 A1 | 1/2013 | Schwartz et al. | |
| 2013/0047022 A1 | 2/2013 | Koertzen et al. | |
| 2013/0257525 A1* | 10/2013 | Kosonocky | H05K 1/0262 327/540 |
| 2014/0312866 A1* | 10/2014 | Dobkin | G05F 1/575 323/280 |

FOREIGN PATENT DOCUMENTS

| | | |
|---|---|---|
| JP | 2007335618 A | 12/2007 |
| KR | 20040048028 A | 6/2004 |
| KR | 100801287 B1 | 2/2008 |
| KR | 100801288 B1 | 2/2008 |

\* cited by examiner

TEST INTERFACE BOARD AND TEST SYSTEM INCLUDING THE SAME

CROSS-REFERENCE TO RELATED APPLICATIONS

This application claims the benefit of Korean Patent Application No. 10-2013-0109979, filed on Sep. 12, 2013, in the Korean Intellectual Property Office, the disclosure of which is incorporated herein in its entirety by reference.

BACKGROUND

The inventive concept relates to a test interface board and a test system including the test interface board, and more particularly, to a test interface board including a current supply source and a test system including the test interface board.

As portable electronic apparatuses are more widely used, a demand for low power semiconductor devices increases as well. In order to reduce power consumption of a semiconductor device, an operating voltage of the semiconductor device is gradually lowered, and thus, a margin of the operating voltage is gradually decreased. When a peak current is generated in a semiconductor device, a power voltage level in the semiconductor device decreases accordingly. As a result, for example, data in the semiconductor device is lost or the semiconductor device does not normally operate. Specifically, such problems are generated in a test process in which multiple functions or multiple cells are simultaneously tested to reduce a test time.

SUMMARY

The inventive concept provides a test interface board, which increases the margin of an operating voltage in a test process, and a test system including the test interface board.

According to an aspect of the inventive concept, there is provided a test interface board. The test interface board can include a substrate including a power plane electrically connected to at least one power terminal of a semiconductor device under test, and a ground plane electrically connected to at least one ground terminal of the semiconductor device under test, and a voltage regulator arranged on the substrate and configured to supply, via the power plane and the ground plane, to the semiconductor device under test, a driving voltage.

The voltage regulator can be electrically connected to a power supply. The voltage regulator can include an input terminal to which a power voltage of the power supply is applied. A ground terminal of the voltage regulator can be electrically connected to a ground of the power supply and to the ground plane. An output terminal of the voltage regulator can be electrically connected to the power plane.

The voltage regulator can further include a reference voltage input terminal to which a reference voltage is applied. The output terminal of the voltage regulator can supply, via the power plane, to the semiconductor device under test, the driving voltage based at least on the reference voltage.

The voltage regulator can further include a comparison unit configured to compare the reference voltage and the driving voltage, and to output a control signal, and an output unit configured to supply the driving voltage and an associated current to the power plane based at least on the control signal, wherein the driving voltage is based at least on the power voltage from the power supply.

When the driving voltage has a level that is higher than a level of the reference voltage, the voltage regulator can decrease an amount of the current supplied to the power plane to decrease the level of the driving voltage. When the driving voltage has a level that is lower than the level of the reference voltage, the voltage regulator can increase the amount of the current supplied to the power plane to increase the level of the driving voltage.

The voltage regulator can further include a reference voltage generation unit configured to generate a reference voltage. The output terminal can supply, via the power plane, to the semiconductor device under test, the driving voltage based at least on the reference voltage.

The reference voltage generation unit can include a diode connected between the input terminal and the ground terminal, or between the output terminal and the ground terminal, and the reference voltage can correspond to a breakdown voltage.

The voltage regulator can further include a comparison voltage generation unit configured to generate a comparison voltage based at least on the driving voltage, a comparison unit configured to compare the reference voltage and the comparison voltage, and to output a control signal, and an output unit configured to supply the driving voltage and an associated current to the power plane based at least on the control signal, wherein the driving voltage is based at least on the power voltage from the power supply.

The comparison voltage generation unit can include a variable device. A ratio of the comparison voltage to the driving voltage can be determined by the variable device. The driving voltage can be determined by a value obtained by dividing the reference voltage by the ratio.

The substrate can further include a plurality of data conductors electrically connected to a plurality of data input/output terminals of the semiconductor device under test. The plurality of data conductors can be connected to a plurality of data input/output channels of an automatic test equipment apparatus.

The automatic test equipment apparatus can include the power supply, and the automatic test equipment apparatus can output, via a power output channel, the power voltage of the power supply.

The substrate can include at least one of another power plane electrically connected to at least one of another power terminal of at least one of another semiconductor device under test. The substrate can include at least one of another ground plane electrically connected to at least one of another ground terminal of the at least one of another semiconductor device under test. The test interface board further can include at least one of another voltage regulator arranged on the substrate and configured to supply, via the at least one of another power plane and the at least one of another ground plane, to the at least one of another semiconductor device under test, the driving voltage.

The power plane can further be electrically connected to the at least one power terminal of at least one of another semiconductor device under test. The ground plane can further be electrically connected to the at least one ground terminal of the at least one of another semiconductor device under test. The voltage regulator can supply, via the power plane and the ground plane, to the at least one of another semiconductor device under test, the driving voltage.

The substrate can further include at least one power contact electrically connecting the power plane to the at least one power terminal of the semiconductor device under test. In some embodiments, at least one ground contact is electrically connecting the ground plane to the at least one ground terminal of the semiconductor device under test.

The substrate can further include a first decoupling capacitor connected between the at least one power contact and the at least one ground contact. The first decoupling capacitor can have a capacitance that is greater than 1 pF and less than 1000 pF.

The substrate can further include a second decoupling capacitor connected between the power plane and the ground plane. The second decoupling capacitor can have a capacitance that is greater than 1 μF and less than 1000 μF.

The semiconductor device under test can be a semiconductor die formed by splitting a semiconductor wafer through a dicing process, and comprises a semiconductor circuit. The test interface board can be a probe card comprising needles directly connected to terminals of the semiconductor die.

The semiconductor device under test can be a semiconductor package in which a semiconductor circuit is formed. The test interface board can be a hi-fix board on which at least one socket for loading at least one semiconductor package is mounted.

According to another aspect of the inventive concept, there is provided a test interface board for testing a semiconductor device under test, the semiconductor device under test comprising a plurality of power terminals and a plurality of ground terminals. The test interface board can include a substrate comprising a first power plane electrically connected to a first power terminal from among the plurality of power terminals of the semiconductor device under test, a second power plane electrically connected to a second power terminal from among the plurality of power terminals of the semiconductor device under test, a first ground plane electrically connected to a first ground terminal from among the plurality of ground terminals of the semiconductor device under test, and a second ground plane electrically connected to a second ground terminal from among the plurality of ground terminals of the semiconductor device under test, a first voltage regulator arranged on the substrate and configured to supply, via the first power plane and the first ground plane, to the semiconductor device under test, a driving voltage, and a second voltage regulator arranged on the substrate and configured to supply, via the second power plane and the second ground plane, to the semiconductor device under test, the driving voltage.

According to another aspect of the inventive concept, there is provided an automatic test equipment apparatus configured to test a semiconductor device under test, a test interface board connected between the semiconductor device under test and the automatic test equipment apparatus, wherein the test interface board comprises a power plane electrically connected to at least one power terminal of the semiconductor device under test, and a ground plane electrically connected to at least one ground terminal of the semiconductor device under test, and a voltage regulator configured to supply, via the power plane and the ground plane, to the semiconductor device under test, a driving voltage.

The voltage regulator can include an input terminal electrically connected to a power voltage output channel of the automatic test equipment apparatus, the power voltage output channel being configured to output a power voltage to the input terminal, a ground terminal electrically connected to the ground plane and to a ground of the automatic test equipment apparatus, and an output terminal electrically connected to the power plane.

The voltage regulator can further include a reference voltage input terminal that is electrically connected to a reference voltage output channel of the automatic test equipment apparatus. The reference voltage output channel can be configured to output a reference voltage to the reference voltage input terminal. The output terminal can be configured to supply, via the power plane, to the semiconductor device under test, the driving voltage based at least on the reference voltage.

The system can further include a power supply that is configured to output a power voltage. The voltage regulator can further include an input terminal to which the power voltage output from the power supply is applied, a ground terminal electrically connected to the ground plane and to a ground of the power supply, and an output terminal electrically connected to the power plane.

The voltage regulator can further include a reference voltage input terminal that is connected to a reference voltage output channel of the automatic test equipment apparatus. The reference voltage output channel can be configured to output a reference voltage to the reference voltage input terminal. The output terminal can be configured to supply, via the power plane, to the semiconductor device under test, the driving voltage based at least on the reference voltage.

The voltage regulator can further include a reference voltage generation unit configured to generate a reference voltage. The output terminal can be configured to supply, via the power plane, to the semiconductor device under test, the driving voltage based at least on the reference voltage.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
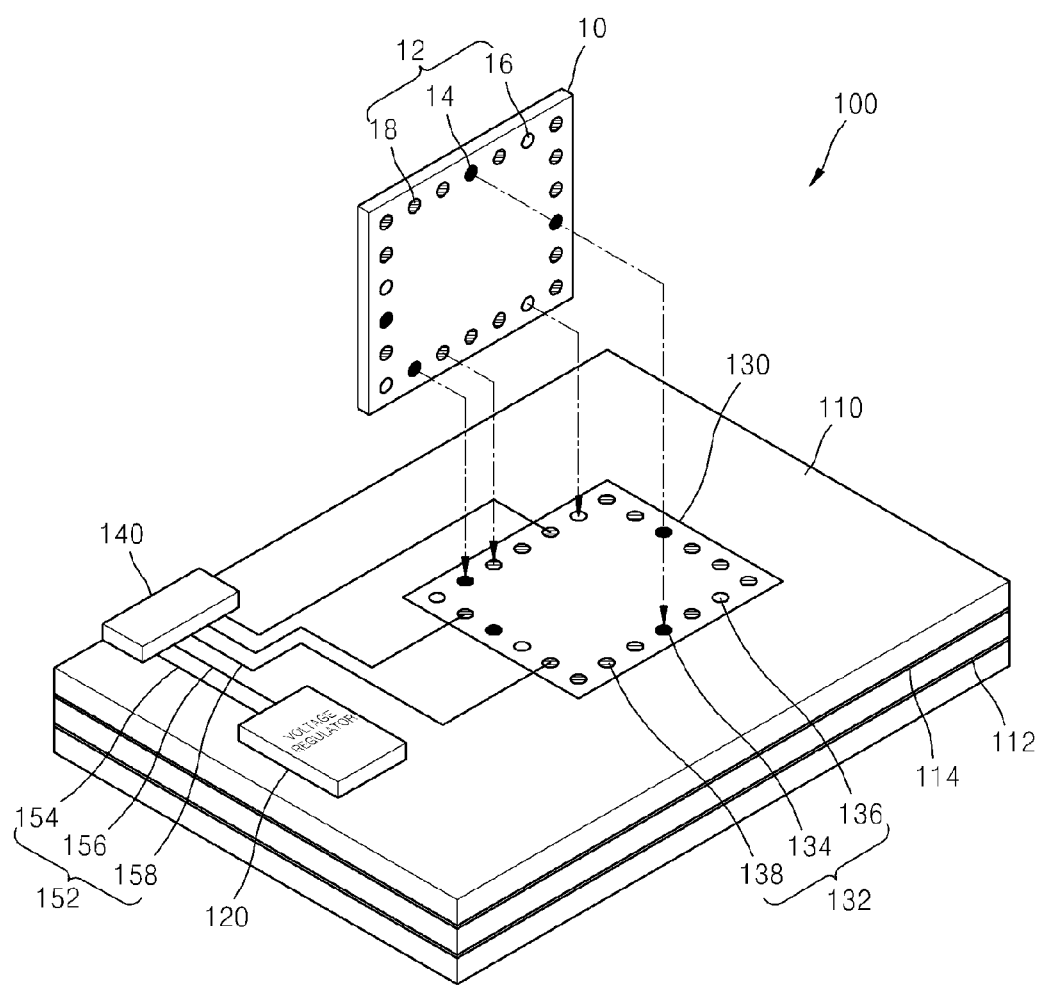
FIG. 1 is a perspective view schematically illustrating a test interface board according to an exemplary embodiment of the inventive concept.

As used herein, expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. The terms such as "first" and "second" are used herein merely to describe a variety of constituent elements, but the constituent elements are not limited by the terms. The terms are used only for the purpose of distinguishing one constituent element from another constituent element. For example, without departing from the right scope of the present inventive concept, a first constituent element may be referred to as a second constituent element, and vice versa.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

FIG. 1 is a perspective view schematically illustrating a test interface board 100 according to an exemplary embodiment of the inventive concept. Referring to FIG. 1, the test interface board 100 includes a substrate 110 and a voltage regulator 120 arranged on the substrate 110 and supplying a driving voltage to a semiconductor device under test (DUT) 10. The test interface board 100 is connected between a test equipment device (not shown) and the semiconductor device under test 10, which can be used to test the semiconductor device under test 10.

The semiconductor device under test 10 can be connected to the test equipment device via the test interface board 100. The semiconductor device under test 10 includes a circuit device formed in a semiconductor manufacturing process. The semiconductor device under test 10 may include a volatile memory device, for example, static RAM (SRAM), dynamic RAM (DRAM), synchronous DRAM (SDRAM), etc., or the like. The semiconductor device under test 10 may also include a non-volatile memory device, for example, such as read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc., or the like. The semiconductor device under test 10 may include a non-memory device such as a microprocessor, a controller, a logic circuit, etc. The semiconductor device under test 10 may include a system semiconductor device such as system large scale integration (LSI) where a logic circuit and a memory circuit are integrated.

The semiconductor device under test 10 may be a semiconductor device in a wafer level before a packaging process is performed after the circuit device is formed in the semiconductor manufacturing process. The semiconductor device under test 10 may be a semiconductor die obtained in a dicing process of splitting a semiconductor wafer where a semiconductor circuit is formed. In this case, the test interface board 100 may be a probe card used to test a semiconductor die. Contacts 132 of the test interface board 100 may have a shape of a needle.

The semiconductor device under test 10 may be a semiconductor package obtained by packaging the semiconductor die where the semiconductor circuit is formed. The semiconductor device under test 10 may be in the form of an integrated package obtained by integrating a plurality of homogeneous or heterogeneous semiconductor packages into one package. In this case, the test interface board 100 may be a hi-fix board and the contacts 132 of the test interface board 100 may have a shape of a socket where the semiconductor package is loaded.

The semiconductor device under test 10 may include a plurality of terminals 12 to be connected to the test interface board 100. The terminals 12 may include at least one power terminal 14, at least one ground terminal 16, and at least one data terminal 18. One or more signals can be transmitted through the terminals 12. A driving voltage of the semiconductor device under test 10 is applied via the power terminal 14. A ground voltage of the semiconductor device under test 10 is applied via the ground terminal 16. In the specifications of the semiconductor device under test 10, the driving voltage may be referred to as VDD, VDD1, or VDD2 and the ground voltage may be referred to as VSS, VSS1, VSS2, or GND. It will be understood that the specifications of the semiconductor device under test 10 may refer to the driving voltage using different terminology, but will still fall within the inventive concepts disclosed herein. Data such as commands, addresses, or input/output data cam be input or output with respect to the semiconductor device under test 10 via the data terminal 18. Although FIG. 1 illustrates that the semiconductor device under test 10 includes the four (4) power terminals 14, the four (4) ground terminals 16, and the fourteen (14) data terminals 18, this is exemplary and the present inventive concept is not limited by the number of the power terminals 14, the number of the ground terminals 16, the number of the data terminals 18, and the total number of the terminals 12.

The terminals 12 may have a variety of shapes according to the shape of the semiconductor device under test 10. For example, when the semiconductor device under test 10 has a shape of a semiconductor die, the terminals 12 may have a shape of a contact pad. When the semiconductor device under test 10 have a shape of a semiconductor package, the terminals 12 may have a variety of shapes, such as a ball shape, a pad shape, a lead shape, a pin shape, etc., according to the shape of a package.

The substrate 110 may include a connection region 130 for connecting to the semiconductor device under test 10. A plurality of contacts 132 corresponding to the terminals 12 of the semiconductor device under test 10 are arranged in the connection region 130. The contacts 132 may include at least one power contact 134, at least one ground contact 136, and at least one data contact 138, corresponding to the terminals 12. As it is illustrated in FIG. 1, the semiconductor device under test 10 may be arranged directly on or adjacent to the connection region 130. Accordingly, the power terminals 14, the ground terminals 16, and the data terminals 18 of the semiconductor device under test 10 are electrically connected to the power contacts 134, the ground contacts 136, and the data contacts 138 of the test interface board 100, respectively.

Although FIG. 1 illustrates that the test interface board 100 is used to test one semiconductor device under test 10, this is exemplary. Alternatively or in addition, a plurality of the semiconductor devices under test 10 may be simultaneously connected to the test interface board 100.

The substrate 110 includes a power plane 112 connected to the power contacts 134, and a ground plane 114 connected to the ground contacts 136. The substrate 110 may include a printed circuit board. The substrate 110 may include a multilayer printed circuit board having a plurality of conductive layers, which are separated from each other by insulation layers interposed therebetween. One of the conductive layers may include the power plane 112 and another conductive layer may include the ground plane 114. The power plane 112 may be connected to the power contacts 134 using a via contact plug (not shown) that penetrates the insulation layers and the conductive layers between the power plane 112 and the power contacts 134. The ground plane 114 may be connected to the ground contacts 136 using a via contact plug that penetrates the insulation layers and the conductive layers between the ground plane 114 and the ground contacts 136.

The voltage regulator 120 supplies a driving voltage and a ground voltage to the semiconductor device under test 10 via the power plane 112 and the ground plane 114, respectively. The voltage regulator 120 supplies the driving voltage to the power plane 112 and the ground voltage to the ground plane 114. The voltage regulator 120 maintains a difference in the electric potential between the power plane 112 and the ground plane 114 at a level of the driving voltage by functioning as an active device.

Although FIG. 1 illustrates that the test interface board 100 includes one voltage regulator 120, this is exemplary. Alternatively or in addition, the test interface board 100 may include a plurality of voltage regulators 120. Also, although FIG. 1 illustrates that one voltage regulator 120 is connected to one semiconductor device under test 10, this is also exemplary. Alternatively or in addition, the test interface board 100 may include a plurality of voltage regulators 120 connected to a plurality of semiconductor devices under test 10. Alternatively or in addition, one voltage regulator 120 may be connected to a plurality of semiconductor device under test 10, or a plurality of voltage regulators 120 may be connected to one semiconductor device under test 10.

The test interface board 100 may further include a connector 140 and conductors 152 (e.g., wires or traces) connected to the connector 140. The connector 140 may be connected to a test apparatus (not shown) for generating a test sequence to test the semiconductor device under test 10. The connector 140 may be connected to a power supply (not shown) for supplying electric power to operate the voltage regulator 120 that supplies a driving voltage to the semiconductor device under test 10. The test apparatus may supply electric power to operate the voltage regulator 120. A single integrated cable or a plurality of cables may be connected to the connector 140. Alternatively or in addition, the test interface board 100 may be installed directly on a test header (not shown) without the connector 140 and the test header may be electrically connected to the test apparatus.

The conductors 152 may include a power wire 154, a ground wire 156, and data wires 158. The power wire 154 and the ground wire 156 may electrically connect the connector 140 and the voltage regulator 120 with each other. The data wires 158 may electrically connect the connector 140 and the data contacts 138 with each other. The data wires 158 need not be electrically connected to all data contacts 138, but rather, may be electrically connected to only the data contacts 138 used to test the semiconductor device under test 10.

Although FIG. 1 illustrates that the conductors 152 are arranged on an upper surface of the substrate 110, this is exemplary and the conductors 152 may be formed by using at least one conductive layer selected from the conductive layers of the substrate 110. The conductors 152 that are formed from an intermediate conductive layer of the substrate 110 may be electrically connected to the voltage regulator 120 and the data contacts 138 arranged on the upper surface of the substrate 110 by using via contact plugs.

The voltage regulator 120 may receive electric power from an external power supply through the connector 140, the power wire 154, and the ground wire 156. The voltage regulator 120 provides a stable driving voltage to the power plane 112 and the ground plane 114 by using the electric power supplied by the power supply. By way of comparison, a capacitor used as a power stabilization device is a passive device, whereas the voltage regulator 120 may include an active device. Accordingly, when a voltage is unstable, the voltage regulator 120 may be able to quickly restore a normal voltage compared to the capacitor.

When a positive output terminal and a negative output terminal of the power supply are directly connected to the power plane 112 and the ground plane 114, respectively, noise of the power supply flows into the semiconductor device under test 10 through the power plane 112 and the ground plane 114. To remove the noise of the power supply, a capacitor having a relatively low decoupling capacitance may be connected to the power plane 112 and the ground plane 114. Also, when the positive output terminal and the negative output terminal of the power supply are directly connected to the power plane 112 and the ground plane 114, respectively without the voltage regulator 120, and when a peak current is generated in the semiconductor device under test 10, a difference in electric potential between the power plane 112 and the ground plane 114 temporarily drops. To prevent dropping of the electric potential difference due to the peak current, a decoupling capacitor having a relatively large capacitance may be connected to the power plane 112 and the ground plane 114.

As the capacity of the semiconductor device under test 10 increases and performance is improved, a current consumed by the semiconductor device under test 10 increases as well. To reduce the current consumption of the semiconductor device under test 10, a driving voltage is gradually decreased and a driving voltage margin indicating a range of an allowable driving voltage decreases. Accordingly, when a high peak current is generated in the semiconductor device under test 10, the electric potential difference between the power plane 112 and the ground plane 114 is out of the driving voltage margin. For example, when the semiconductor device under test 10 is DRAM, the memory capacity increases and, as the driving voltage decreases, the DRAM needs to be refreshed more frequently. Further, the number of memory cells to be refreshed at the same time increases. In particular, a large number of memory cells may be refreshed at one time to reduce a test time in a test process. Accordingly, a peak current increases further. As a result, when a refresh operation is performed, the peak current causes the electric potential difference between the power plane 112 and the ground plane 114 to drop below the allowable driving voltage. Also, data stored in memory cells may be lost due to the refresh operation.

Furthermore, even when a decoupling capacitor having a large capacitance is connected between the power plane 112 and the ground plane 114, such a problem is not solved. As the capacity of the decoupling capacitor increases, the amount of a voltage ripple after the peak current is generated decreases. Nevertheless, a time to return to the normal driving voltage is increased due to a resistor-capacitor (RC) delay that relatively increases. The above problem may cause a more serious problem when a peak current is generated in a state in which the electric potential difference between the power plane 112 and the ground plane 114 fails to return to the normal driving voltage.

The voltage regulator 120 that supplies the driving voltage of the semiconductor device under test 10 by using an active device may instantaneously return the driving voltage that drops, back to the normal driving voltage. Accordingly, since an operation of generating a peak current in the semiconductor device under test 10 can be tested, the test time is reduced and the reliability of the test improved.

Figure 2A:
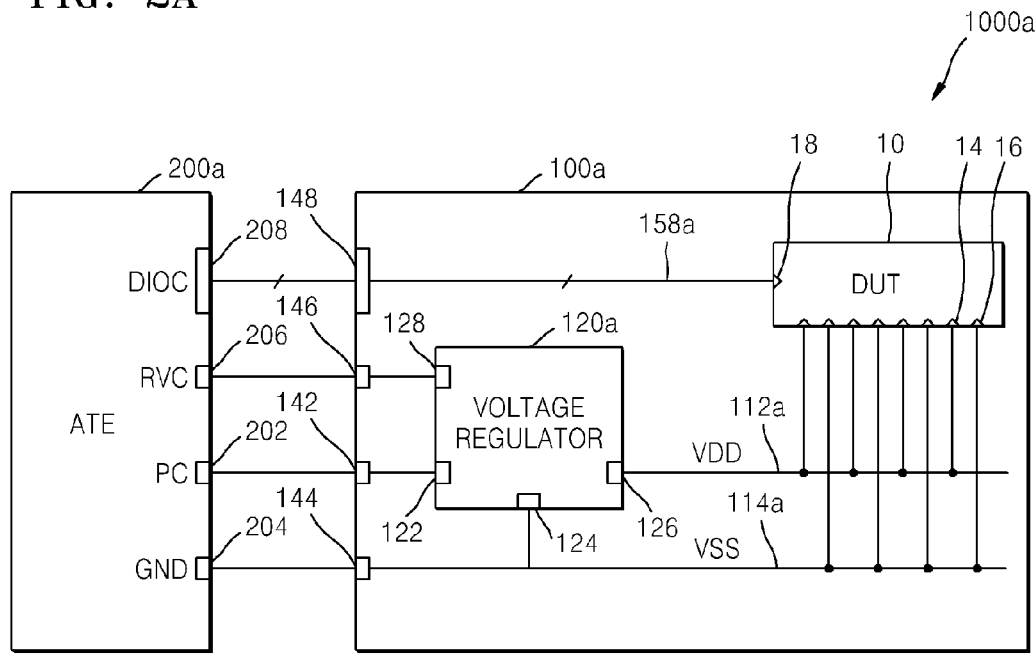
FIG. 2A is a conceptual diagram schematically illustrating a test system according to an exemplary embodiment of the inventive concept.

FIG. 2A is a conceptual diagram schematically illustrating a test system 1000a according to an exemplary embodiment of the inventive concept. Referring to FIG. 2A, a test system 1000a includes a test apparatus such as an automatic test equipment (ATE) apparatus 200a for testing the semiconductor device under test 10. The test system 1000a can also include a test interface board 100a for connecting the semiconductor device under test 10 and the automatic test equipment 200a with one another.

The semiconductor device under test 10 includes the power terminal 14, the ground terminal 16, and the data terminal 18. Since the semiconductor device under test 10 is already described above with reference to FIG. 1, a detailed description is not repeated.

The test interface board 100a can be connected to the semiconductor device under test 10 and includes a voltage regulator 120a. The test interface board 100a includes a power input terminal 142, a ground input terminal 144, a reference voltage input terminal 146, and a data input/output terminal 148, which can be connected to the automatic test equipment 200a. The power input terminal 142, the ground input terminal 144, the reference voltage input terminal 146, and the data input/output terminal 148 may collectively constitute the connector 140 of FIG. 1.

The voltage regulator 120a includes an input terminal 122 to which electric power is applied, a ground terminal 124 connected to a ground 204 of the automatic test equipment 200a, an output terminal 126 for outputting a driving voltage, and a reference voltage input terminal 128 to which a reference voltage is applied.

The test interface board 100a includes a power plane 112a for connecting the power terminal 14 of the semiconductor device under test 10 and the output terminal 126 of the voltage regulator 120a with each other. In addition, the test interface board 100a includes a ground plane 114a for connecting the ground terminal 16 of the semiconductor device under test 10 and the ground terminal 124 of the voltage regulator 120a with each other. The power plane 112a and the ground plane 114a may correspond to the power plane 112 and the ground plane 114 of FIG. 1, and are indicated as conductors (e.g., wires or traces) in FIG. 2.

The automatic test equipment 200a may provide the test sequence to test the semiconductor device under test 10. The automatic test equipment 200a can include a power output channel (PC) 202, a ground (GND) 204, a reference voltage output channel (RVC) 206, and a data input/output channel (DIOC) 208. The power output channel 202 supplies electric power to operate the voltage regulator 120a via the power input terminal 142 of the test interface board 100a. The electric power supplied by the automatic test equipment 200a is applied to the input terminal 122 of the voltage regulator 120a. The power output channel 202 may have a predetermined voltage and may supply the electric power using an amount of current that is less than or equal to a maximum current allowance. The power output channel 202 may function as a power supply at least in the sense of outputting a direct voltage.

The ground 204 is connected to the ground plane 114a via the ground input terminal 144 of the test interface board 100a. Since the ground plane 114a is connected to the ground terminal 114a of the semiconductor device under test 10, the automatic test equipment 200a, the test interface board 100a, and a semiconductor under test have the same ground electric potential. Although FIG. 2A illustrates that the test system 1000a is formed by using the ground 204 of the automatic test equipment 200a, the automatic test equipment 200a may include a separate power output channel for outputting a negative voltage, instead of the ground 204. The separate power output channel that outputs a negative voltage may be connected to the ground plane 114a via the ground input terminal 144 of the test interface board 100a.

The reference voltage output channel 206 is connected to the reference voltage input terminal 128 of the voltage regulator 120a via the reference voltage input terminal 146 of the test interface board 100a. The reference voltage output channel 206 outputs a predetermined constant reference voltage. The reference voltage may correspond to an output voltage of the voltage regulator 120a that may be adjusted by adjusting the reference voltage. In order to adjust the driving voltage of the semiconductor device under test 10, a tester may adjust the reference voltage output from the reference voltage output channel 206. In other words, the driving voltage may be determined by the reference voltage. The reference voltage may be the same as the output voltage of the voltage regulator 120a. The reference voltage may be less than the voltage output from the power output channel 202.

The data input/output channel 208 is connected to the data terminal 18 of the semiconductor device under test 10 via the data input/output terminal 148 of the test interface board 100a. The automatic test equipment 200a may output the test sequence to test the semiconductor device under test 10 via the data input/output channel 208 and receive data output by the semiconductor device under test 10.

For example, when the semiconductor device under test 10 is DRAM, the automatic test equipment 200a may write a predetermined data pattern to all memory cells and read out the data pattern again. The automatic test equipment 200*a* may transmit a predetermined data pattern and a command to write the data pattern to the semiconductor device under test 10, and receive and execute the command and the data pattern. The automatic test equipment 200*a* may transmit a read command to the semiconductor device under test 10 and the semiconductor device under test 10 may output the data pattern stored in the semiconductor device under test 10.

In another example, the semiconductor device under test 10 may include the test sequence therein. The automatic test equipment 200*a* may issue a command to execute the test sequence by itself to the semiconductor device under test 10. The semiconductor device under test 10 may receive the command, execute the test sequence by itself, and transmit a result of the test to the automatic test equipment 200*a*.

The input terminal 122 of the voltage regulator 120*a* can receive the electric power from the power output channel 202 of the automatic test equipment 200*a*. The voltage regulator 120*a* and the reference voltage input terminal 128 can receive the reference voltage from the reference voltage output channel 206. The ground terminal 124 of the voltage regulator 120*a* is connected to the ground 204 of the automatic test equipment 200*a* and the ground plane 114*a*. The output terminal 126 of the voltage regulator 120*a* outputs the output voltage that is output by the voltage regulator 120*a* to the power plane 112*a*.

The voltage regulator 120*a* outputs the output voltage corresponding to the reference voltage via the output terminal 126 based at least on the reference voltage provided by the reference voltage input terminal 128 using the electric power supplied through the input terminal 122. The output voltage is provided as a driving voltage to the semiconductor device under test 10 via the power plane 112*a*. The voltage regulator 120*a* is described below in additional detail with reference to FIGS. 3A to 3C.

The test interface board 100*a* may include a plurality of voltage regulators 120*a*. When the test interface board 100*a* includes a plurality of voltage regulators 120*a*, a plurality of power output channels 202 of the automatic test equipment 200*a* may be connected to the voltage regulators 120*a*. In another example, one power output channel 202 of the automatic test equipment 200*a* may supply electric power to a plurality of voltage regulators 120*a*, or a plurality of power output channels 202 of the automatic test equipment 200*a* may be connected to one voltage regulator 120*a*, according to the average current consumption amount and the amount of a peak current of the semiconductor device under test 10.

Alternatively or in addition, when the test interface board 100*a* includes a plurality of voltage regulators 120*a*, a plurality of reference voltage output channels 206 of the automatic test equipment 200*a* may be connected to the reference voltage input terminal 128 of the voltage regulators 120*a*. In another example, since a relatively small amount of current is supplied to the reference voltage input terminal 128 of a plurality of voltage regulators 120*a*, one reference voltage output channel 206 of the automatic test equipment 200*a* may be commonly connected to the reference voltage input terminal 128 of a plurality of voltage regulators 120*a*.

Figure 2B:
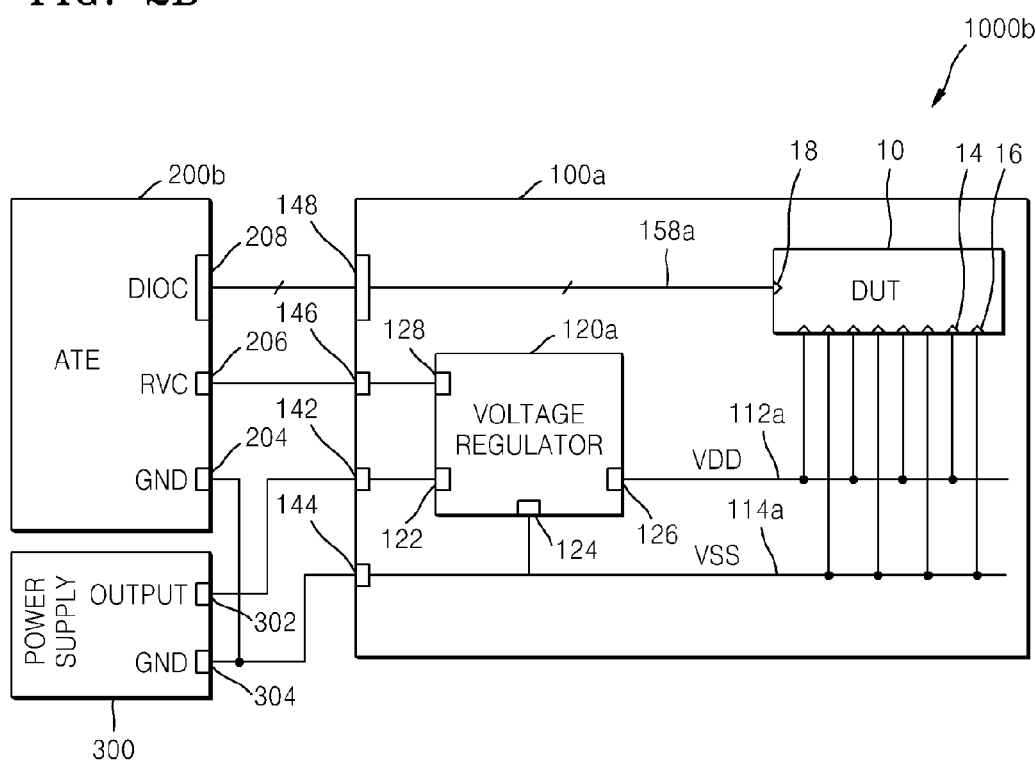
FIG. 2B is a conceptual diagram schematically illustrating a test system according to another exemplary embodiment of the inventive concept.

FIG. 2B is a conceptual diagram schematically illustrating a test system 1000*b* according to another exemplary embodiment of the inventive concept. Referring to FIG. 2B, the test system 1000*b* can include an automatic test equipment (ATE) apparatus 200*b* for testing the semiconductor device under test 10. In addition, the test system 1000*b* can include a power supply 300. Moreover, the test system 1000*b* can include the test interface board 100*a* for connecting the semiconductor device under test 10, the automatic test equipment 200*b*, and the power supply 300 with one another. Since the semiconductor device under test 10 and the test interface board 100*a* are already described above with reference to FIG. 2A, detailed descriptions thereof are not repeated.

The automatic test equipment 200*b* includes the ground 204, the reference voltage output channel 206, and the data input/output channel 208, but without the power output channel 202 that is associated with the automatic test equipment 200*a* of FIG. 2A. The electric power supplied from the power output channel 202 of the automatic test equipment 200*a* of FIG. 2A is instead provided directly by the power supply 300 in the test system 1000*b*.

The power supply 300 includes an output terminal 302 and a ground 304. The output terminal 302 of the power supply 300 supplies electric power to operate the voltage regulator 120*a* via the power input terminal 142 of the test interface board 100*a*. The ground 304 of the power supply 300 is commonly connected to the ground 204 of the automatic test equipment 200*b* and the ground input terminal 144 of the test interface board 100*a*.

In view of the voltage regulator 120*a* of the test interface board 100*a*, the electric power supplied by the power supply 300 is applied to the input terminal 122, and the reference voltage supplied from the reference voltage output channel 206 of the automatic test equipment 200*b* is applied to the reference voltage input terminal 128. The ground terminal 124 is electrically connected to the ground 204 of the automatic test equipment 200*b* and the ground 304 of the power supply 300. The output terminal 126 of the voltage regulator 120*a* outputs the output voltage that is output by the voltage regulator 120*a* to the power plane 112*a*. The output voltage is supplied to the semiconductor device under test 10 as a driving voltage.

The automatic test equipment 200*b* can be high-priced equipment having a plurality of channels capable of outputting a voltage and a current according to a sequence previously set by an operator. The voltage and current output by the automatic test equipment 200*b* may have a high quality. As the power consumption of the semiconductor device under test 10 increases, the automatic test equipment 200*b* may output electric power to test the semiconductor device under test 10 using one power output channel. For example, the maximum current to be output from the power output channel of the automatic test equipment 200*b* may be 1 Amp (A). In contrast, a peak current exceeding 1 A may be generated in the semiconductor device under test 10. Accordingly, to test the semiconductor device under test 10, the driving voltage of the semiconductor device under test 10 may be supplied via two or more power output channels.

The power supply 300 may be a DC power apparatus that outputs a constant voltage. Since the power supply 300 is widely used in a variety of fields, the power supply 300 is generally inexpensive, compared to the automatic test equipment 200*b*. The quality of an output voltage that is output by the power supply 300 is lower than that of a voltage output from the power output channel of the automatic test equipment 200*b*. In other words, the output voltage that is output by the power supply 300 has a wider range of fluctuation than the voltage output from the power output channel of the automatic test equipment 200*b*.

Since the voltage regulator 120*a* stabilizes electric power supplied from the outside and provides stabilized electric power to the semiconductor device under test 10, the quality of electric power supplied to the voltage regulator 120*a* does not seriously matter. In other words, the voltage regulator 120a allows for a wider variation in the quality of the electric power supplied from an external source. Accordingly, as the test system 100b is configured by using the power supply 300 that is inexpensive, instead of using the automatic test equipment 200b that is expensive, the test costs may be reduced.

Figure 2C:
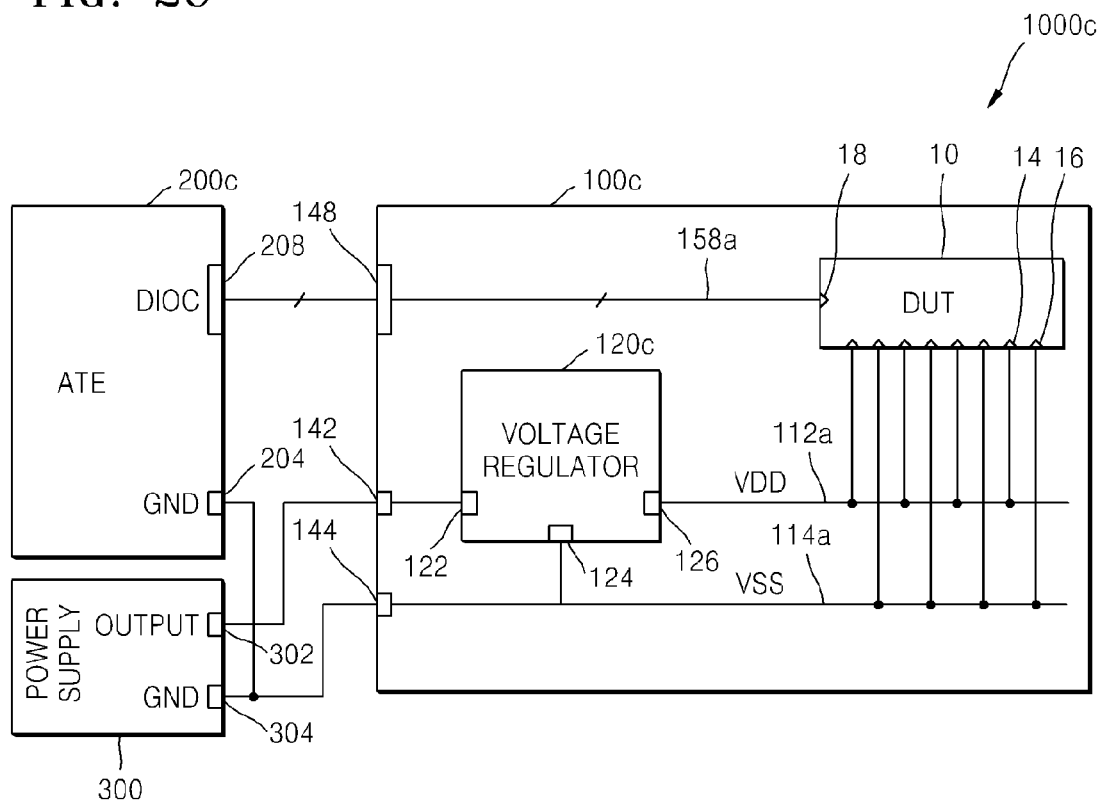
FIG. 2C is a conceptual diagram schematically illustrating a test system according to another exemplary embodiment of the inventive concept.

FIG. 2C is a conceptual diagram schematically illustrating a test system 1000c according to another exemplary embodiment of the inventive concept. Referring to FIG. 2C, the test system 1000c includes an automatic test equipment (ATE) apparatus 200c for testing the semiconductor device under test 10. In addition, the test system 1000c includes the power supply 300 for supplying electric power. Moreover, the test system 1000c includes a test interface board 100c for connecting the semiconductor device under test 10, the automatic test equipment 200c, and the power supply 300 with one another. Since the semiconductor device under test 10 and the test interface board 100a are already described above with reference to FIG. 2A, detailed descriptions thereof are not repeated.

The interface board 100c includes a voltage regulator 120c having no reference voltage input terminal, unlike the automatic test equipment 200a of FIG. 2A. Also, the interface board 100c does not include the reference voltage input terminal.

The automatic test equipment 200c includes the ground 204 and the data input/output channel 208, but without the reference voltage output channel 206 that is associated with the automatic test equipment 200b of FIG. 2B. The voltage regulator 120c is capable of internally generating a reference voltage corresponding to the reference voltage that is output from the reference voltage output channel 206 of the automatic test equipment 200b. The voltage regulator 120c will be described below in detail with reference to FIGS. 4A and 4B.

In another example, the test system 1000c may supply electric power to the voltage regulator 120c by using the power output channel 202 of the automatic test equipment 200a of FIG. 2A, without using the separate power supply 300.

Figure 3A:
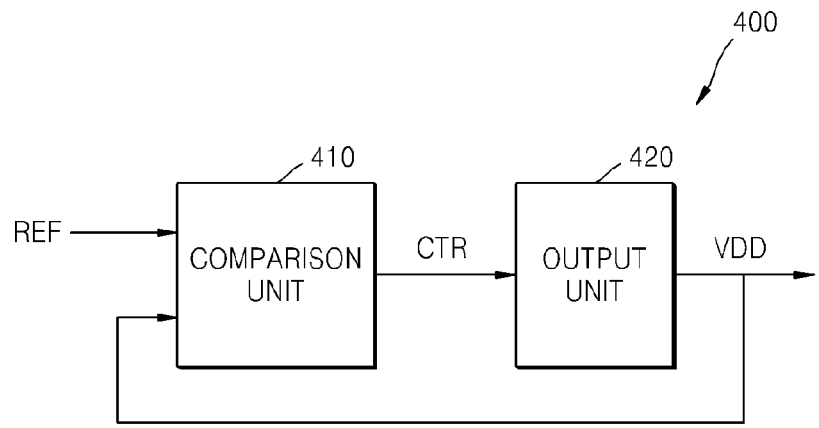
FIG. 3A is a block diagram schematically illustrating a voltage regulator according to an exemplary embodiment of the inventive concept.

FIG. 3A is a block diagram schematically illustrating a voltage regulator 400 according to an exemplary embodiment of the inventive concept. Referring to FIG. 3A, the voltage regulator 400 may include a comparison unit 410 and an output unit 420. The voltage regulator 400 corresponds to the voltage regulators 120a and 120b of FIGS. 2A and 2B.

The comparison unit 410 receives a reference voltage REF and a driving voltage VDD, compares the reference voltage REF and the driving voltage VDD, and outputs a control signal CTR according to a comparison result. The output unit 420 receives the control signal CTR and outputs the driving voltage VDD according to the control signal CTR.

Referring back to FIGS. 2A and 2B, the reference voltage REF is provided from the reference voltage output channel 206 of the automatic test equipment 200a. The driving voltage VDD input to the comparison unit 410 is a feedback of the driving voltage VDD output from the output unit 420. The driving voltage VDD is provided to the power terminal 14 of the semiconductor device under test 10 via the power plane 112a. The semiconductor device under test 10 is driven by using the driving voltage VDD and performs a test operation according to the test sequence.

Figure 3B:
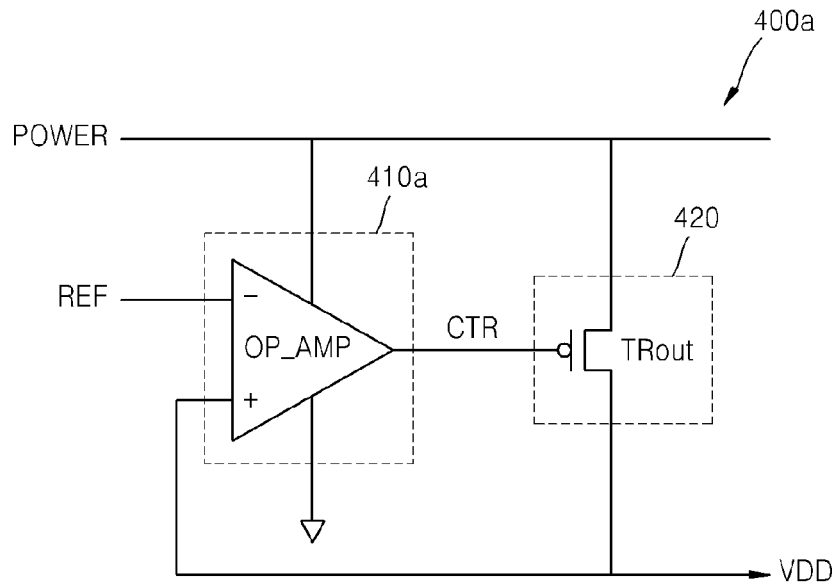
FIG. 3B is a circuit diagram schematically illustrating an example of the voltage regulator of FIG. 3A.

FIG. 3B is a circuit diagram schematically illustrating an example 400a of the voltage regulator 400 of FIG. 3A.

Referring to FIG. 3B, a comparison unit 410a includes an operation amplifier OP_AMP, and the output unit 420 includes a transistor TRout. The comparison unit 410a corresponds to the comparison unit 410 of FIG. 3A.

The operation amplifier OP_AMP includes an inverse terminal (−) to which the reference voltage REF is applied and a non-inverse terminal (+) to which the driving voltage VDD is applied. The operation amplifier OP_AMP includes an output terminal for outputting the control signal CTR. The operation amplifier OP_AMP is driven by electric power POWER supplied by the power output channel 202 of the automatic test equipment 200a of FIG. 2A or the output terminal 302 of the power supply 300 of FIG. 2B. The operation amplifier OP_AMP is grounded to the ground 204 of the automatic test equipment 200a of FIG. 2A or the ground 304 of the power supply 300 of FIG. 2B, via the ground input terminal 144. As described above, the ground input terminal 144 is connected to the ground plane 114a.

The operation amplifier OP_AMP outputs the control signal CTR via the output terminal. When the driving voltage VDD is higher than the reference voltage REF, a voltage level of the control signal CTR increases. When the driving voltage VDD is lower than the reference voltage REF, the voltage level of the control signal CTR decreases.

The transistor TRout forming the output unit 420 is a P-channel metal oxide semiconductor (MOSFET) including a control terminal to which the control signal CTR is applied, a first terminal connected to the electric power POWER, and a second terminal for outputting the driving voltage VDD. The output unit 420 is not limited to the above P-channel MOSFET. Alternatively, an N-channel MOSFET or a bipolar junction transistor (BJT) may be used as the output unit 420.

When the voltage level of the control signal CTR increases, the amount of a current flowing from the first terminal to the second terminal of the transistor TRout decreases. In contrast, when the voltage level of the control signal CTR decreases, the amount of a current flowing from the first terminal to the second terminal of the transistor TRout increases.

When the driving voltage VDD is higher than the reference voltage REF, the voltage level of the control signal CTR increases and thus the amount of the current flowing from the first terminal to the second terminal of the transistor TRout decreases. As a result, since the amount of the current supplied to the power plane 112a decreases, the level of the driving voltage VDD decreases. When the driving voltage VDD is lower than the reference voltage REF, the voltage level of the control signal CTR decreases and thus the amount of the current flowing from the first terminal to the second terminal of the transistor TRout increases. As a result, since the amount of the current supplied to the power plane 112a increases, the level of the driving voltage VDD increases. As such operations are repeated, the driving voltage VDD has the same voltage level as the reference voltage REF.

Accordingly, the voltage regulator 400a including the operation amplifier OP_AMP and the transistor TRout, which are active devices, may quickly stabilize the voltage level of the power plane 112a. Consequently, the voltage regulator 400a supplies a stable driving voltage VDD to the semiconductor device under test 10.

Figure 3C:
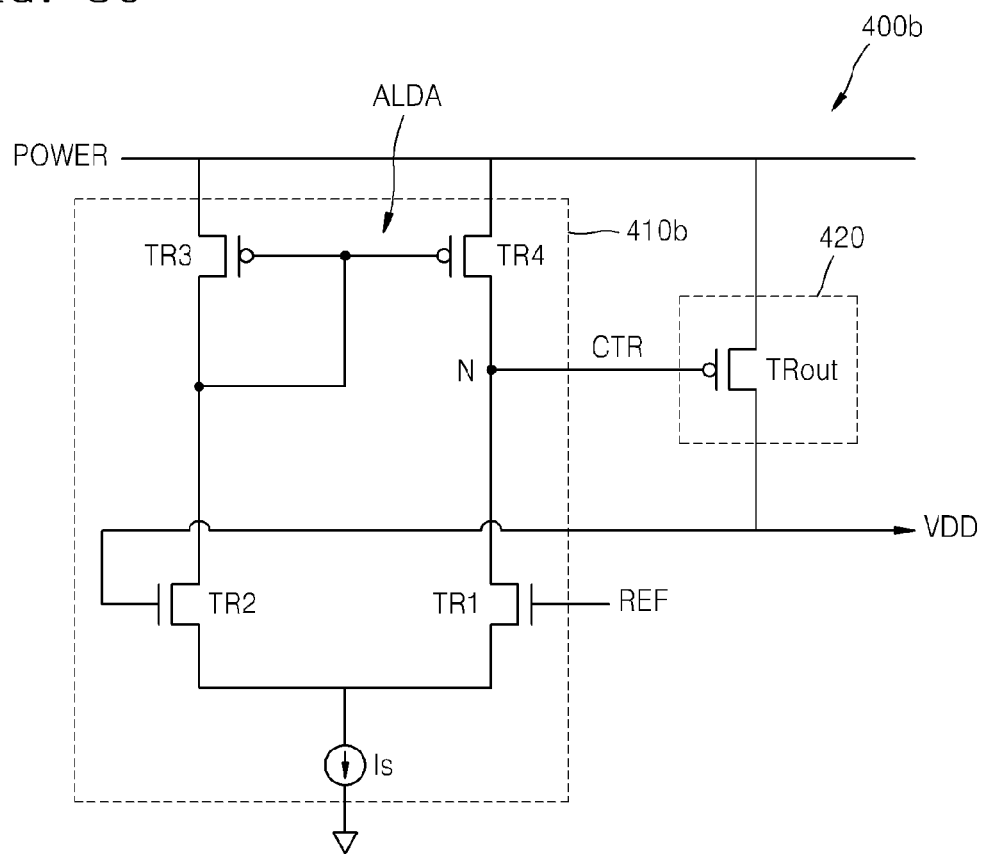
FIG. 3C is a circuit diagram schematically illustrating another example of the voltage regulator of FIG. 3A.

FIG. 3C is a circuit diagram schematically illustrating another example 400b of the voltage regulator 400 of FIG. 3A. Referring to FIG. 3C, a comparison unit 410b includes an active-loaded differential amplifier (ALDA) having an active load and a bias current source Is. The output unit 420 includes the transistor TRout. The comparison unit 410b corresponds to the comparison unit 410 of FIG. 3A. Since the output unit 420 is already described above with reference to FIG. 3B, a description thereof is not repeated.

The ALDA includes a first transistor TR1 having a control terminal to which the reference voltage REF is applied, and a second transistor TR2 having a control terminal to which the driving voltage VDD is applied. The first and second transistors TR1 and TR2 are connected to the bias current source Is. The ALDA includes third and fourth transistors TR3 and TR4 connected in a current mirror. The third and fourth transistors TR3 and TR4 are connected to the electric power (i.e., labeled POWER) and respectively connected to the second and first transistors TR2 and TR1. A node N between the first transistor TR1 and the fourth transistor TR4 outputs the control signal CTR.

When the driving voltage VDD and the reference voltage REF are identical to each other, the left side and the right side of the ALDA having an active load are balanced. When the driving voltage VDD increases to be higher than the reference voltage REF, the current flowing through the second transistor TR2 increases to be higher than the current flowing through the first transistor TR1. As the current flowing through the second transistor TR2 increases, the current flowing through the fourth transistor TR4 by the current mirror formed by the third and fourth transistors TR3 and TR4 increases. Accordingly, the voltage level of the node N is increased to be high by the ALDA having an active load. As the voltage level of the control signal CTR increases, the amount of the current flowing from the electric power POWER to the power plane 112a decreases and the level of the driving voltage VDD decreases. When the driving voltage VDD is lower than the reference voltage REF, the voltage level of the node N is reduced by the ALDA having an active load. As the voltage level of the control signal CTR decreases, the amount of the current flowing from the electric power POWER to the power plane 112a increases and the driving voltage VDD increases. As such operations are repeated, the driving voltage VDD has the same voltage level as the reference voltage REF.

Accordingly, the voltage regulator 400b, including the ALDA having an active load and the transistor TRout, may quickly stabilize the voltage level of the power plane 112a and supply a stable driving voltage VDD to the semiconductor device under test 10.

Figure 4A:
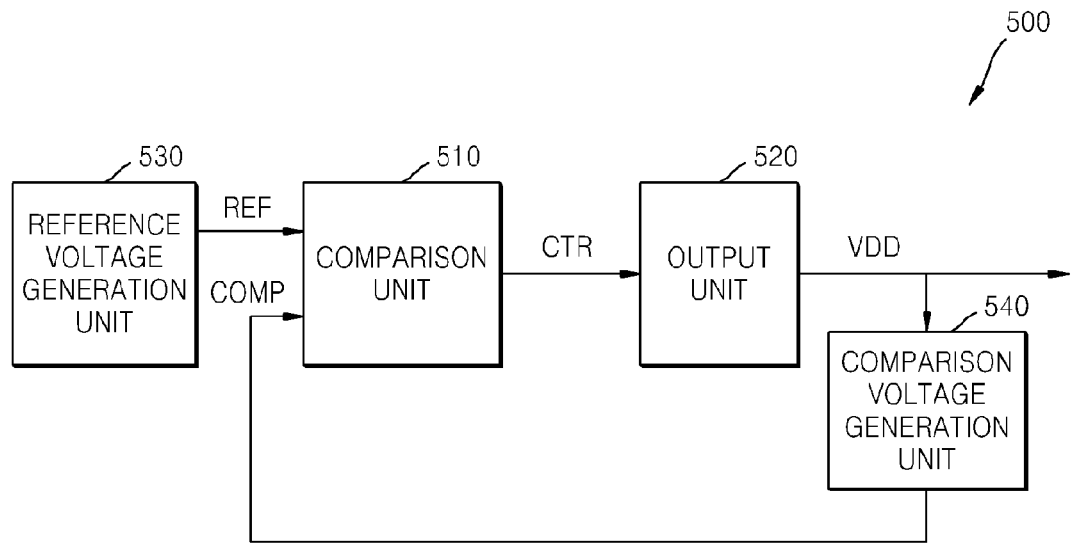
FIG. 4A is a block diagram schematically illustrating a voltage regulator according to another exemplary embodiment of the inventive concept.

FIG. 4A is a block diagram schematically illustrating a voltage regulator 500 according to another exemplary embodiment of the inventive concept. Referring to FIG. 4A, the voltage regulator 500 includes a reference voltage generation unit 530, a comparison unit 510, an output unit 520, and a comparison voltage generation unit 540. The voltage regulator 500 corresponds to the voltage regulator 120c of FIG. 2C.

The reference voltage generation unit 530 generates the reference voltage REF. The voltage regulator 500, unlike the voltage regulator 400, internally generates the reference voltage REF in the reference voltage generation unit 530 without receiving the reference voltage REF from the outside.

The comparison unit 510 receives the reference voltage REF from the reference voltage generation unit 530, receives a comparison voltage COMP from the comparison voltage generation unit 540, compares the reference voltage REF and the comparison voltage COMP, and outputs the control signal CTR according to a comparison result. The output unit 520 receives the control signal CTR and outputs the driving voltage VDD according to the control signal CTR.

The comparison voltage generation unit 540 generates the comparison voltage COMP based at least on the driving voltage VDD. The comparison voltage generation unit 540 may adjust a ratio of the comparison voltage COMP to the driving voltage VDD according to a user's control. The driving voltage VDD is determined based on the reference voltage REF and the ratio.

Referring to FIG. 2C and FIG. 4A together, the reference voltage REF can be internally generated without receiving the reference voltage REF from the automatic test equipment 200c. As the comparison voltage COMP based at least on the driving voltage VDD output from the output unit 420 is input to the comparison unit 510, a feedback loop is formed. The driving voltage VDD output from the output unit 420 can be provided to the power terminal 14 of the semiconductor device under test 10 via the power plane 112a. The semiconductor device under test 10 can be driven according to the driving voltage VDD and can perform a test operation according to the test sequence.

Figure 4B:
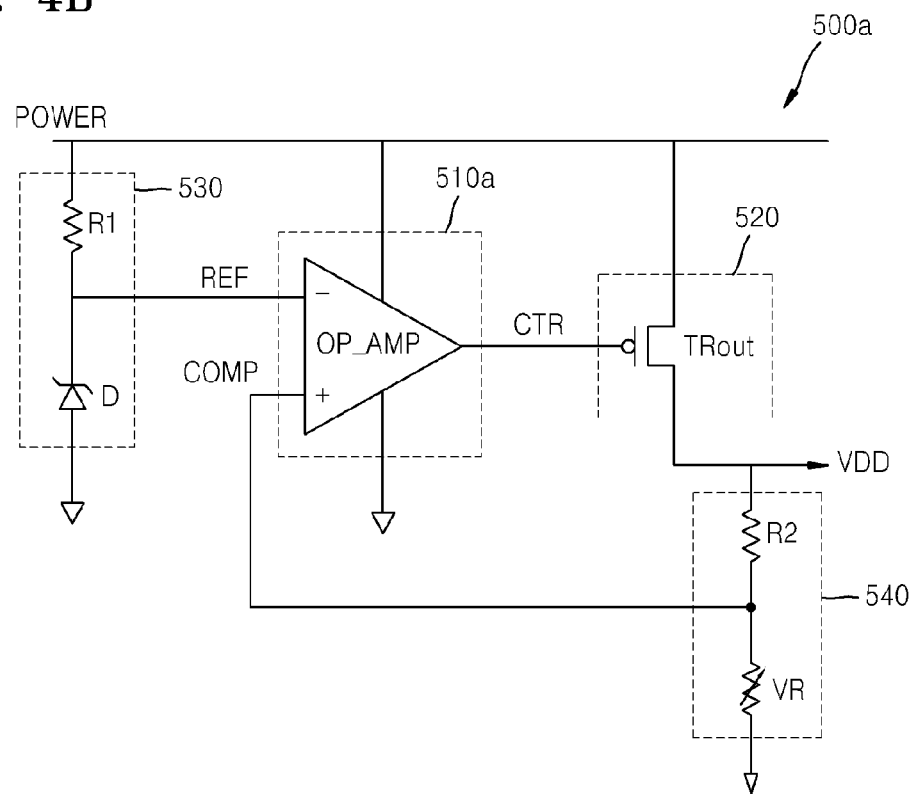
FIG. 4B is a circuit diagram schematically illustrating an example of the voltage regulator of FIG. 4A.

FIG. 4B is a circuit diagram schematically illustrating an example 500a of the voltage regulator 500 of FIG. 4A. Referring to FIG. 4B, the reference voltage generation unit 530 includes a resistance R1 and a diode D that are serially connected. As illustrated in FIG. 4B, the diode D may be a Zener diode that is connected in a reverse direction. The Zener diode connected in a forward direction exhibits the same diode characteristic as a general diode. However, when the Zener diode is connected in a reverse direction, the Zener diode may have a constant breakdown voltage. The reference voltage REF is generated by using the breakdown voltage.

In another example, although FIG. 4B illustrates that the diode D is connected in a reverse direction, the diode D may be a diode connected in the forward direction, that is, a diode having an anode connected to the resistor R1 and a cathode connected to the ground plane 114a. When a voltage higher than a threshold voltage is applied to opposite ends of the diode connected in the forward direction, a current flows in the forward direction. When the current in the forward direction is constant, the diode connected in the forward direction has a constant voltage drop. Since the electric power POWER has a relatively constant voltage, the current flowing in the reference voltage generation unit 530 is constant and the diode connected in the forward direction has a constant voltage drop. The amount of the voltage drop occurring in the diode connected in the forward direction may be designed in advance by using the resistor R1. The reference voltage REF is generated by using the voltage drop occurring in the diode connected in the forward direction.

Also, according to another example, although FIG. 4B illustrates that the reference voltage generation unit 530 is connected between the electric power POWER and the ground plane 114a, the reference voltage generation unit 530 may be connected between the driving voltage VDD and the ground plane 114a. Since the driving voltage VDD has a more stable and constant level than the electric power POWER, the current flowing in the diode D, that is, the diode connected in the forward direction, is also constant. Accordingly, a further constant reference voltage REF may be generated.

A comparison unit 510a includes an operation amplifier (OP_AMP). The comparison unit 510a corresponds to the comparison unit 410 of FIG. 4A. The operation amplifier OP_AMP includes an inverse terminal (−) to which the reference voltage REF is applied and a non-inverse terminal (+) to which the comparison voltage COMP is applied. The operation amplifier OP_AMP includes an output terminal for outputting the control signal CTR. The operation amplifier OP_AMP is driven by the electric power POWER supplied through the output terminal 302 of the power supply 300 of FIG. 2C or the power output channel 202 of the automatic test equipment 200a of FIG. 2A. The operation amplifier OP_AMP is grounded to the ground 304 of the power supply 300 of FIG. 2C or the ground 204 of the automatic test equipment 200a of FIG. 2A, via the ground input terminal 144. As described above, the ground input terminal 144 is connected to the ground plane 114a.

The operation amplifier OP_AMP outputs the control signal CTR via the output terminal. When the comparison voltage COMP is higher than the reference voltage REF, the voltage level of the control signal CTR increases. When the comparison voltage COMP is lower than the reference voltage REF, the voltage level of the control signal CTR decreases.

The output unit 520 includes a transistor TRout. The transistor TRout forming the output unit 520 can be a p-channel metal oxide semiconductor (MOSFET) including a control terminal to which the control signal CTR is applied. The transistor TRout can include a first terminal connected to the electric power POWER, and a second terminal for outputting the driving voltage VDD. The output unit 520 is not limited to the above P-channel MOSFET. For example, an N-channel MOSFET or a bipolar junction transistor (BJT) may instead be used as the output unit 520.

When the voltage level of the control signal CTR increases, the amount of current flowing from the first terminal to the second terminal of the transistor TRout decreases and the level of the driving voltage VDD decreases. In contrast, when the voltage level of the control signal CTR decreases, the amount of the current from the first terminal to the second terminal of the transistor TRout increases and the level of the driving voltage VDD increases.

The comparison voltage generation unit 540 is a voltage distributor including a resistor R2 and a variable resistor VR that are serially connected. The comparison voltage generation unit 540 generates the comparison voltage COMP in proportion to the driving voltage VDD by using the voltage distributor including the resistor R2 and the variable resistor VR. When the resistor R2 and the variable resistor VR have the same amount of resistance, the comparison voltage COMP has an amount equal to the half of the amount of the driving voltage VDD. According to another example, the comparison voltage generation unit 540 may include a voltage distributor having different types of devices instead of the resistor R2 and the variable resistor VR. Moreover, the comparison voltage generation unit 540 may include a voltage distributor further including different types of devices in addition to the resistor R2 and the variable resistor VR.

A resistance value of the variable resistor VR may be adjusted by an operator. The reference voltage REF is generated by the reference voltage generation unit 530 to have a fixed level. In other words, in some embodiments, the operator may not change the reference voltage REF. As the operator changes the level of the driving voltage VDD through the resistance value of the variable resistor VR, a desired level of the driving voltage VDD may be determined. More specifically, when the resistance value of the variable resistor VR is the same as the resistance value of the resistor R2, the driving voltage VDD is determined such that the reference voltage REF and the comparison voltage COMP have the same level, and thus, the driving voltage VDD has a level that is double the level of the reference voltage REF.

For example, when the resistance value of the variable resistor VR is set to be the half of the resistance value of the resistor R2, the comparison value COMP has the same level as ⅓ of the driving voltage VDD. Since the level of the driving voltage VDD is determined by a feedback circuit such that the reference voltage REF and the comparison voltage COMP are the same, the driving voltage VDD has a level that is three times higher than the reference voltage REF. In contrast, when the resistance value of the variable resistor VR is set to be higher than the resistance value of the resistor R2, the driving voltage VDD has a level that is smaller than a level that is double the level of the reference voltage REF.

The operator may determine the ratio r of the comparison voltage COMP to the driving voltage VDD by adjusting the variable resistor VR. The driving voltage VDD is determined to be a level obtained by multiplying the reference voltage REF by a reciprocal of the ratio r, that is, by 1/r. When an operator intends to set the level of the driving voltage VDD to be higher than the current level of the driving voltage VDD, the operator may achieve this by decreasing the variable resistance VR. When an operator intends to set the level of the driving voltage VDD to be lower than the current level of the driving voltage VDD, the operator may achieve this by increasing the variable resistance VR.

When the level of the driving voltage VDD is temporarily decreased, the comparison voltage COMP also decreases. As the comparison unit 510a decreases the level of the control signal CTR and the output unit 520 increases the amount of current supplied to the power plane 112a, the level of the driving voltage VDD is rapidly restored to a normal level. Since the operation amplifier OP_AMP and the transistor TRout, which are active devices, are used, the driving voltage VDD may be more quickly restored to the normal level, compared to a case in which a passive device is used.

By way of another example, the comparison unit 510a may use the ALDA having an active load in the comparison unit 410b of FIG. 3C.

Figure 5:
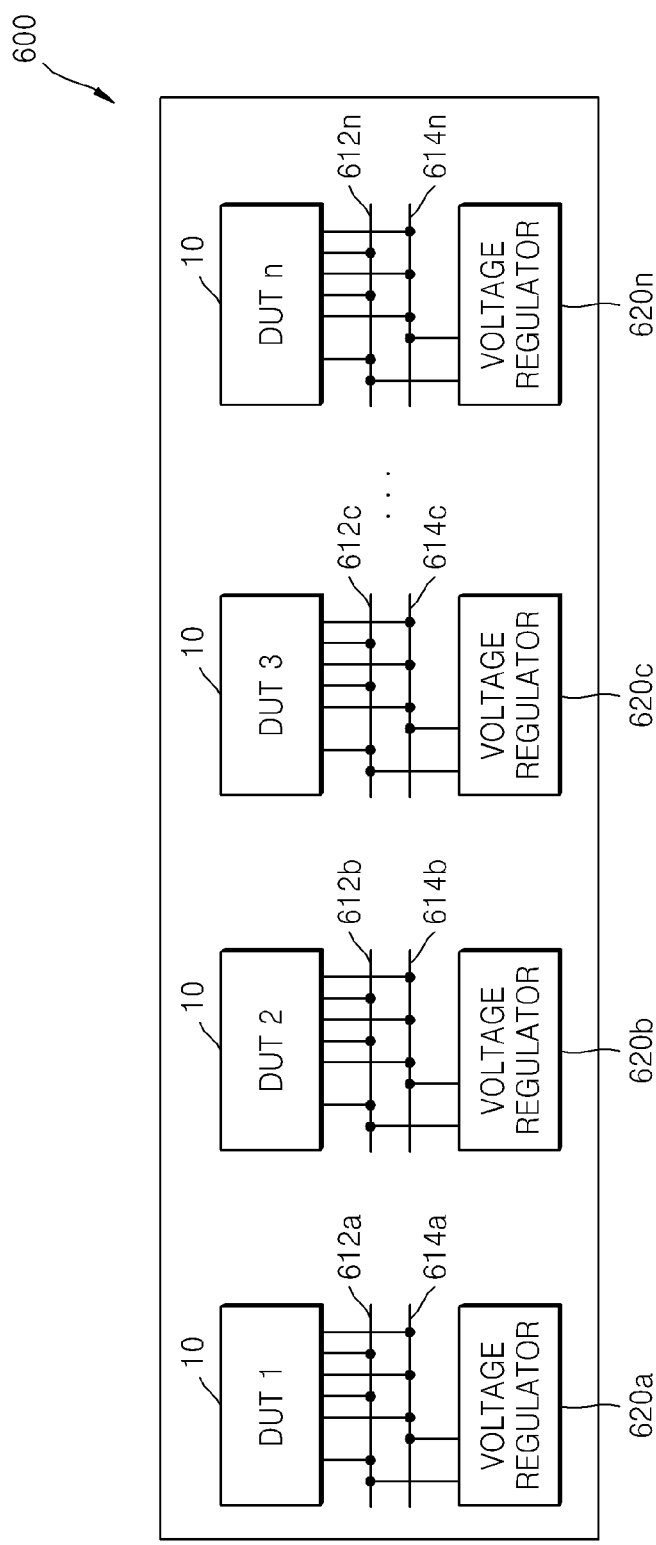
FIG. 5 is a block diagram schematically illustrating a test interface board according to another exemplary embodiment of the inventive concept.

FIG. 5 is a block diagram schematically illustrating a test interface board 600 according to another exemplary embodiment of the inventive concept. Referring to FIG. 5, the test interface board 600 may test a plurality of semiconductor devices under test 10. The number of the semiconductor devices under test 10 that may be tested on the test interface board 600 is not limited, and it is assumed in the following description that n-number of the semiconductor devices under test 10 are tested on one test interface board 600, where n is any suitable integer. FIG. 5 mainly illustrates the electric power supplied by the test interface board 600 to the semiconductor devices under test 10 and does not illustrate a test signal related to the test sequence of the semiconductor devices under test 10.

The test interface board 600 includes n-number of voltage regulators 620a, 620b, 620c, . . . , 620n corresponding to n-number of semiconductor devices under test 10. Also, the test interface board 600 includes n-number of power planes 612a, 612b, 612c, . . . , 612n and n-number of ground planes 614a, 614b, 614c, . . . , 614n corresponding to the n-number of semiconductor devices under test 10.

The driving voltage VDD and the ground voltage VSS are supplied to the n-number of power planes 612a, 612b, 612c, . . . , 612n and the n-number of ground planes 614a, 614b, 614c, . . . , 614n, respectively, by the n-number of voltage regulators 620a, 620b, 620c, . . . , 620n corresponding thereto. The n-number of power planes 612a, 612b, 612c, . . . , 612n and the n-number of ground planes 614a, 614b, 614c, . . . , 614n are connected to the power terminals and the ground terminals, respectively, of the n-number of semiconductor devices under test 10 corresponding thereto. Although FIG. 5 illustrates that the n-number of ground planes 614a, 614b, 614c, . . . , 614n are separated from one another, the n-number of ground planes 614a, 614b, 614c, . . . , 614n may be continuously connected to one another.

The test interface board 600 includes a plurality of voltage regulators 620a, 620b, 620c, . . . , 620n for respectively supplying the driving voltage VDD and the ground voltage VSS to the semiconductor devices under test 10. Accordingly, the semiconductor devices under test 10 may be tested at one time (i.e., simultaneously) and thus a test time and test costs may be reduced.

The voltage regulators 620a, 620b, 620c, . . . , 620n may receive electric power from a plurality of power output channels of the automatic test equipment. The automatic test equipment may measure electric power consumed by each of the semiconductor devices under test 10. According to another example, the number of voltage regulators 620a, 620b, 620c, . . . , 620n and the number of power output channels need not be identical to each other. For example, two of the voltage regulators 620a, 620b, 620c, . . . , 620n may receive electric power from one power output channel, and/or one of the voltage regulators 620a, 620b, 620c, . . . , 620n may receive electric power from two or more power output channels.

According to another example, the voltage regulators 620a, 620b, 620c, . . . , 620n may commonly receive electric power by a large capacity power supply.

Figure 6:
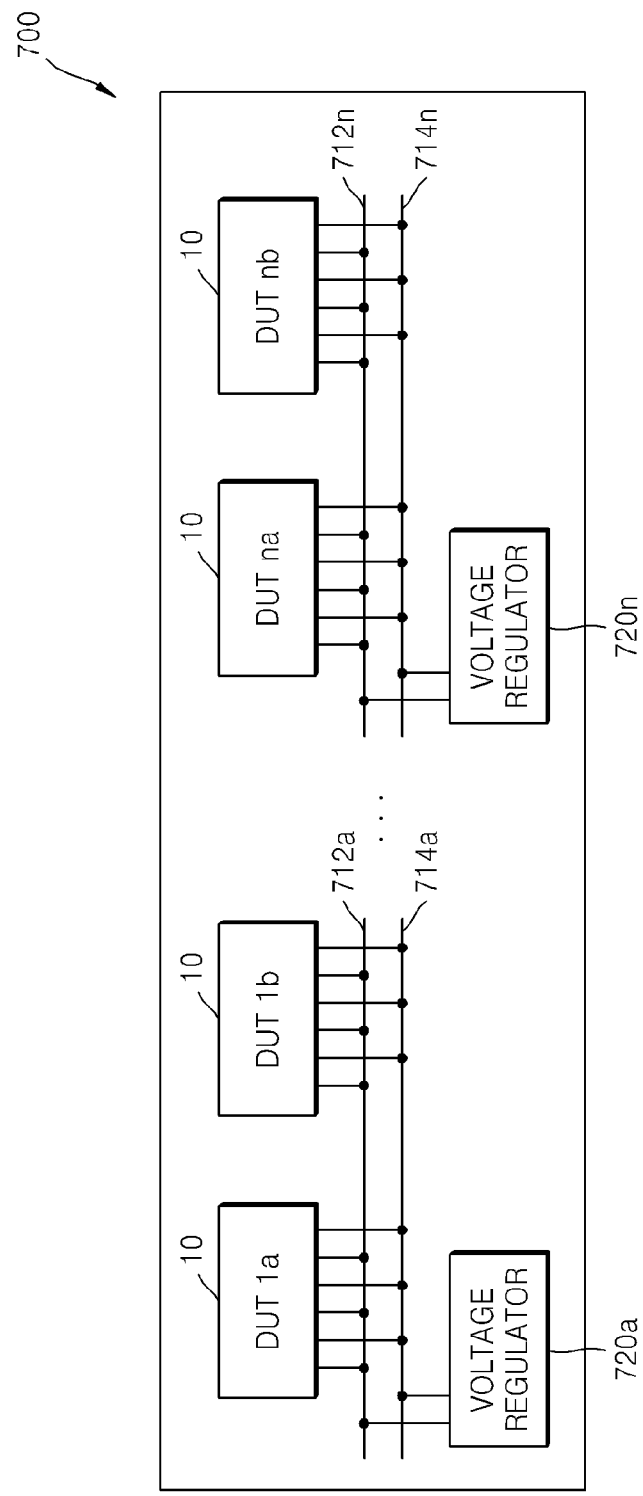
FIG. 6 is a block diagram schematically illustrating a test interface board according to yet another exemplary embodiment of the inventive concept.

FIG. 6 is a block diagram schematically illustrating a test interface board 700 according to another exemplary embodiment of the inventive concept. The number of the semiconductor devices under test 10 that may be tested on the test interface board 700 is not limited. It is assumed in the following description that 2n-number of the semiconductor devices under test 10 are tested on one test interface board 700. FIG. 6 mainly illustrates the electric power supplied by the test interface board 700 to the semiconductor devices under test 10, and does not illustrate a test signal related to the test sequence of the semiconductor devices under test 10.

The test interface board 700 includes n-number of voltage regulators 720a, . . . , 720n. Also, the test interface board 700 includes n-number of power planes 712a, . . . , 712n and n-number of ground planes 714a, . . . , 714n corresponding to the n-number of voltage regulators 720a, . . . , 720n. The driving voltage VDD and the ground voltage VSS is respectively applied by the n-number of voltage regulators 720a, . . . , 720n to the n-number of power planes 712a, . . . , 712n and the n-number of ground planes 714a, . . . , 714n.

The power terminals and the ground terminals of the semiconductor devices under test 10 may be connected to a pair of the power planes 712a, . . . , 712n and the ground planes 714a, . . . , 714n. Although FIG. 6 illustrates two semiconductor devices under test 10 are connected to the power planes 712a, . . . , 712n and the ground planes 714a, . . . , 714n, this is exemplary and the number of the semiconductor devices under test 10 connected to the pair of the power planes 712a, . . . , 712n and the ground planes 714a, . . . , 714n is not limited thereto. The number of the semiconductor devices under test 10 connected to the pair of the power planes 712a, . . . , 712n and the ground planes 714a, . . . , 714n may be determined according to the consumption power, for example, the amount of a peak current, of the semiconductor device under test 10, and/or according to the capacity of each of the voltage regulators 720a, . . . , 720n. Although FIG. 6 illustrates that the n-number of ground planes 714a, . . . , 714n are separated from one another, the n-number of ground planes 714a, . . . , 714n may be continuously connected to one another.

The voltage regulators 720a, . . . , 720n may correspond to the voltage regulators 620a, 620b, 620c, . . . , 620n, which are described above with reference to FIG. 5, and therefore a detailed description thereof is not repeated.

Figure 7:
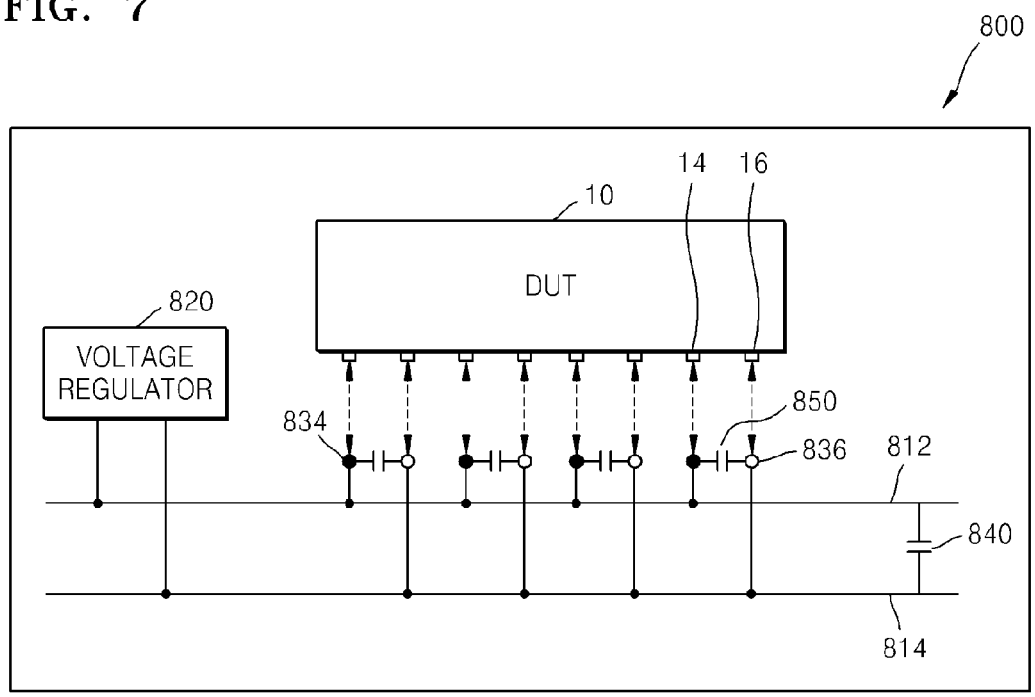
FIG. 7 is a block diagram schematically illustrating a test interface board according to still another exemplary embodiment of the inventive concept.

FIG. 7 is a block diagram schematically illustrating a test interface board 800 according to another exemplary embodiment of the inventive concept. Referring to FIG. 7, the test interface board 800 includes a power contact 834 and a ground contact 836 respectively connected to the power terminal 14 and the ground terminal 16 of the semiconductor device under test 10. The test interface board 800 further includes a power plane 812 and a ground plane 814 respectively connected to the power contact 834 and the ground contact 836. In addition, the test interface board 800 includes a voltage regulator 820 for supplying the driving voltage VDD and the ground voltage VSS to the power plane 812 and the ground plane 814, respectively.

The power contact 834, the ground contact 836, the power plane 812, the ground plane 814, and the voltage regulator 820 of the test interface board 800 correspond to the power contact 134, the ground contact 136, the power plane 112, the ground plane 114, and the voltage regulator 120, respectively, of the test interface board 100 of FIG. 1, and thus, detailed descriptions thereof are not repeated.

The test interface board 800 includes a first decoupling capacitor 850 that is connected between the power contact 834 and the ground contact 836. The first decoupling capacitor 850 is provided to shield noise that is mixed in the driving voltage VDD and the ground voltage VSS supplied by the voltage regulator 820. The first decoupling capacitor 850 has a capacitance that is greater than 1 pF and less than 1000 pF. The first decoupling capacitor 850 may be formed of a ceramic capacitor.

The test interface board 800 includes a second decoupling capacitor 840 that is connected between the power plane 812 and the ground plane 814. The second decoupling capacitor 840 is provided to further stabilize a difference in the electric potential between the power plane 812 and the ground plane 814. In some embodiments, the second decoupling capacitor 840 can have a capacitance that is greater than 1 µF and less than 1000 µF. The second decoupling capacitor 840 may be formed of a Tantal capacitor.

Since the test interface board 800 includes not only the voltage regulator 820 but also the first and second decoupling capacitors 850 and 840, the test interface board 800 supplies more stable electric power to the semiconductor device under test 10.

Figure 8:
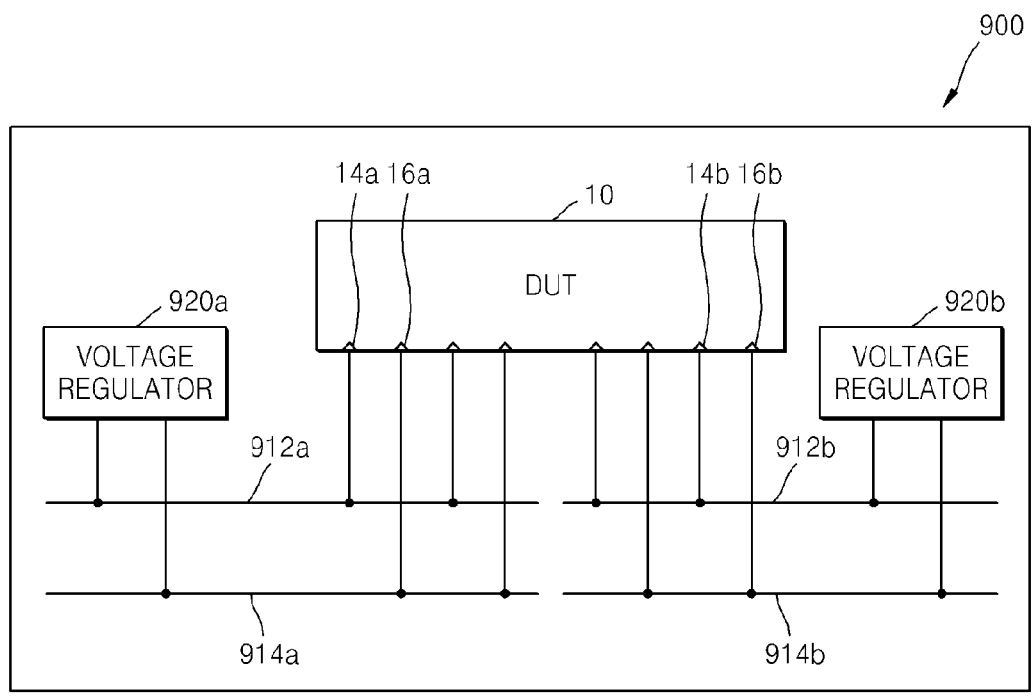
FIG. 8 is a block diagram schematically illustrating a test interface board according to another exemplary embodiment of the inventive concept.

FIG. 8 is a block diagram schematically illustrating a test interface board 900 according to another exemplary embodiment of the inventive concept. Referring to FIG. 8, the test interface board 900 includes a first power plane 912a, a first ground plane 914a, and a voltage regulator 920a for supplying the driving voltage VDD and the ground voltage VSS to each of the first power plane 912a and the first ground plane 914a, respectively. The test interface board 900 also includes a second power plane 912b, a second ground plane 914b, and a voltage regulator 920b for supplying the driving voltage VDD and the ground voltage VSS to each of the second power plane 912b and the second ground plane 914b, respectively.

The semiconductor device under test 10 tested by using the test interface board 900 includes a plurality of power terminals 14a and 14b and a plurality of ground terminals 16a and 16b. Some of the power terminals 14a and some of the ground terminals 16a of the semiconductor device under test 10 are connected to the first power plane 912a and the first ground plane 914a, respectively. Also, some others of the power terminals 14b and some others of the ground terminals 16b of the semiconductor device under test 10 are connected to the second power plane 912b and the second ground plane 914b, respectively.

The first voltage regulator 920a supplies the driving voltage VDD to the semiconductor device under test 10 via some of the power terminals 14a and some of the ground terminals 16a that are respectively connected to the first power plane 912a and the first ground plane 914a. Also, the second voltage regulator 920b supplies the driving voltage VDD to the semiconductor device under test 10 via some others of the power terminals 14b and some others of the ground terminals 16b that are respectively connected to the second power plane 912b and the second ground plane 914b.

When a peak current is generated in the semiconductor device under test 10, the first and second voltage regulators 920a and 920b together compensate for dropping of the driving voltage VDD due to the peak current, and thus, the driving voltage VDD of the semiconductor device under test 10 may be more quickly restored to the normal level. For example, when a peak current of 1 A is generated in the semiconductor device under test 10, each of the first and second voltage regulators 920a and 920b supplies a current of 500 mA, which is the half of the peak current, to the semiconductor device under test 10, and thus, the driving voltage VDD of the semiconductor device under test 10 may be more quickly restored to the normal level. Also, when the first and second voltage regulators 920a and 920b together supply the driving voltage VDD to the semiconductor device under test 10, the amount of dropping of the driving voltage VDD due to the peak current is reduced to half. Accordingly, since the driving voltage VDD is not reduced under the driving voltage margin, there is no data loss.

Although FIG. 8 illustrates that the first and second ground planes 814a and 814b are separated from each other, the first and second ground planes 814a and 814b may be continuously connected to each other.

Although it is illustrated that in the test interface board 900 of FIG. 8 the first and second voltage regulators 920a and 920b together supply the driving voltage VDD to the semiconductor device under test 10, two or more voltage regulators may supply the driving voltage VDD to the semiconductor device under test 10. In this case, the test interface board 900 includes the same number of power planes as the number of the voltage regulators.

While the inventive concept has been particularly shown and described with reference to exemplary embodiments thereof, it will be understood that various changes in form and details may be made therein without departing from the spirit and scope of the following claims.

What is claimed is:

1. A test interface board, comprising:
a substrate including a power plane electrically connected to at least one power terminal of a semiconductor device under test, and a ground plane electrically connected to at least one ground terminal of the semiconductor device under test; and
a voltage regulator arranged on the substrate and configured to supply, via the power plane and the ground plane, to the semiconductor device under test, a driving voltage,
wherein the voltage regulator is electrically connected to a power supply, and the voltage regulator comprises:
an input terminal to which a power voltage of the power supply is applied;
a ground terminal electrically connected to a ground of the power supply and to the ground plane; and
an output terminal electrically connected to the power plane,
wherein the voltage regulator further comprises a reference voltage generation unit configured to generate a reference voltage, and
wherein the output terminal is configured to supply, via the power plane, to the semiconductor device under test, the driving voltage based at least on the reference voltage.

2. The test interface board of claim 1, wherein:
the voltage regulator further comprises a reference voltage input terminal to which a reference voltage is applied, and
the output terminal of the voltage regulator is configured to supply, via the power plane, to the semiconductor device under test, the driving voltage based at least on the reference voltage.

3. The test interface board of claim 2, wherein the voltage regulator further comprises:
a comparison unit configured to compare the reference voltage and the driving voltage, and to output a control signal; and
an output unit configured to supply the driving voltage and an associated current to the power plane based at least on the control signal, wherein the driving voltage is based at least on the power voltage from the power supply.

4. The test interface board of claim 3, wherein:
when the driving voltage has a level that is higher than a level of the reference voltage, the voltage regulator is configured to decrease an amount of the current supplied to the power plane to decrease the level of the driving voltage, and
when the driving voltage has a level that is lower than the level of the reference voltage, the voltage regulator is configured to increase the amount of the current supplied to the power plane to increase the level of the driving voltage.

5. The test interface board of claim 1, wherein:
the reference voltage generation unit comprises a diode connected between the input terminal and the ground terminal, or between the output terminal and the ground terminal, and
the reference voltage corresponds to a breakdown voltage.

6. The test interface board of claim 1, wherein the voltage regulator further comprises:
a comparison voltage generation unit configured to generate a comparison voltage based at least on the driving voltage;
a comparison unit configured to compare the reference voltage and the comparison voltage, and to output a control signal; and
an output unit configured to supply the driving voltage and an associated current to the power plane based at least on the control signal, wherein the driving voltage is based at least on the power voltage from the power supply.

7. The test interface board of claim 6, wherein:
the comparison voltage generation unit comprises a variable device,
a ratio of the comparison voltage to the driving voltage is determined by the variable device, and
the driving voltage is determined by a value obtained by dividing the reference voltage by the ratio.

8. The test interface board of claim 1, wherein:
the substrate further comprises a plurality of data conductors electrically connected to a plurality of data input/output terminals of the semiconductor device under test, and
the plurality of data conductors are connected to a plurality of data input/output channels of an automatic test equipment apparatus.

9. The test interface board of claim 8, wherein:
the automatic test equipment apparatus comprises the power supply, and
the automatic test equipment apparatus is configured to output, via a power output channel, the power voltage of the power supply.

10. The test interface board of claim 1, wherein:
the substrate comprises at least one of another power plane electrically connected to at least one of another power terminal of at least one of another semiconductor device under test,
the substrate comprises at least one of another ground plane electrically connected to at least one of another ground terminal of the at least one of another semiconductor device under test, and
the test interface board further comprises at least one of another voltage regulator arranged on the substrate and configured to supply, via the at least one of another power plane and the at least one of another ground plane, to the at least one of another semiconductor device under test, the driving voltage.

11. The test interface board of claim 1, wherein:
the power plane is further electrically connected to the at least one power terminal of at least one of another semiconductor device under test,
the ground plane is further electrically connected to the at least one ground terminal of the at least one of another semiconductor device under test, and
the voltage regulator is configured to supply, via the power plane and the ground plane, to the at least one of another semiconductor device under test, the driving voltage.

12. The test interface board of claim 1, wherein the substrate further comprises:
at least one power contact electrically connecting the power plane to the at least one power terminal of the semiconductor device under test; and
at least one ground contact electrically connecting the ground plane to the at least one ground terminal of the semiconductor device under test.

13. The test interface board of claim 12, wherein:
the substrate further comprises a first decoupling capacitor connected between the at least one power contact and the at least one ground contact, and
the first decoupling capacitor has a capacitance that is greater than 1 pF and less than 1000 pF.

14. The test interface board of claim 1, wherein:
the substrate further comprises a second decoupling capacitor connected between the power plane and the ground plane, and
the second decoupling capacitor has a capacitance that is greater than 1 µF and less than 1000 µF.

15. The test interface board of claim 1, wherein:
the semiconductor device under test is a semiconductor die formed by splitting a semiconductor wafer through a dicing process, and comprises a semiconductor circuit, and
the test interface board is a probe card comprising needles directly connected to terminals of the semiconductor die.

16. The test interface board of claim 1, wherein:
the semiconductor device under test is a semiconductor package in which a semiconductor circuit is formed, and
the test interface board is a hi-fix board on which at least one socket for loading at least one semiconductor package is mounted.

17. A test interface board for testing a semiconductor device under test, the semiconductor device under test comprising a plurality of power terminals and a plurality of ground terminals, the test interface board comprising:
a substrate comprising a first power plane electrically connected to a first power terminal from among the plurality of power terminals of the semiconductor device under test, a second power plane electrically connected to a second power terminal from among the plurality of power terminals of the semiconductor device under test, a first ground plane electrically connected to a first ground terminal from among the plurality of ground terminals of the semiconductor device under test, and a second ground plane electrically connected to a second ground terminal from among the plurality of ground terminals of the semiconductor device under test;
a first voltage regulator arranged on the substrate and configured to supply, via the first power plane and the first ground plane, to the semiconductor device under test, a driving voltage; and
a second voltage regulator arranged on the substrate and configured to supply, via the second power plane and the second ground plane, to the semiconductor device under test, the driving voltage,
wherein the first voltage regulator is electrically connected to a power supply, and the first voltage regulator comprises:
an input terminal to which a power voltage of the power supply is applied;
a ground terminal electrically connected to a ground of the power supply and to the first ground plane; and
an output terminal electrically connected to the first power plane,
wherein the first voltage regulator further comprises a reference voltage generation unit configured to generate a reference voltage, and
wherein the output terminal is configured to supply, via the first power plane, to the semiconductor device under test, the driving voltage based at least on the reference voltage.

18. The test interface board of claim 17, wherein:
the reference voltage generation unit comprises a diode connected between the input terminal and the ground terminal, or between the output terminal and the ground terminal, and
the reference voltage corresponds to a breakdown voltage.

19. A test system comprising:
an automatic test equipment apparatus configured to test a semiconductor device under test;
a test interface board connected between the semiconductor device under test and the automatic test equipment apparatus, wherein the test interface board comprises a power plane electrically connected to at least one power terminal of the semiconductor device under test, and a ground plane electrically connected to at least one ground terminal of the semiconductor device under test; and a voltage regulator configured to supply, via the power plane and the ground plane, to the semiconductor device under test, a driving voltage, wherein the voltage regulator is electrically connected to a power supply, and the voltage regulator comprises:

an input terminal to which a power voltage of the power supply is applied;

a ground terminal electrically connected to a ground of the power supply and to the ground plane; and an output terminal electrically connected to the power plane, wherein the voltage regulator further comprises a reference voltage generation unit configured to generate a reference voltage, and wherein the output terminal is configured to supply, via the power plane, to the semiconductor device under test, the driving voltage based at least on the reference voltage.

20. The test system of claim 19, wherein:

the reference voltage generation unit comprises a diode connected between the input terminal and the ground terminal, or between the output terminal and the ground terminal, and the reference voltage corresponds to a breakdown voltage.

* * * * *